(12) United States Patent
Bollati

(10) Patent No.: US 7,095,279 B2
(45) Date of Patent: Aug. 22, 2006

(54) AC DIFFERENTIAL AMPLIFIER WITH REDUCED LOW CORNER FREQUENCY

(75) Inventor: Giacomino Bollati, Castel San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 35 days.

(21) Appl. No.: 10/927,431

(22) Filed: Aug. 26, 2004

(65) Prior Publication Data
US 2005/0206450 A1   Sep. 22, 2005

(30) Foreign Application Priority Data
Aug. 28, 2003   (EP)   ................... 03425561

(51) Int. Cl.
  *H03F 3/45*   (2006.01)
(52) U.S. Cl. ........................... 330/252; 330/283
(58) Field of Classification Search ................ 330/283, 330/252, 253
See application file for complete search history.

(56) References Cited

U.S. PATENT DOCUMENTS

| | | | |
|---|---|---|---|
| 5,510,738 A | 4/1996 | Gorecki et al. | 327/103 |
| 5,867,062 A * | 2/1999 | Kudou | 330/124 R |
| 6,262,628 B1 | 7/2001 | Shinomiya | 330/69 |
| 6,359,503 B1 * | 3/2002 | Alini et al. | 327/552 |
| 2002/0003441 A1 | 1/2002 | Steensgaard-Madsen | 327/54 |

* cited by examiner

*Primary Examiner*—Robert Pascal
*Assistant Examiner*—Hieu Nguyen
(74) *Attorney, Agent, or Firm*—Lisa K. Jorgenson; Allen, Dyer, Doppelt, Milbrath & Gilchrist, P.A.

(57) ABSTRACT

An AC differential amplifier includes a pair of identical differential transconductance stages. Each transconductance stage includes a pair of inputs and a pair of outputs. The pairs of output of the transconductance stages are connected in common, and form a pair of output nodes of the AC differential amplifier. The pair of output nodes is also connected to a supply line through respective load resistors. One input of one transconductance stage is coupled through a capacitive device to an input of the other transconductance stage. The other inputs of the transconductance stages form the input terminals of the AC differential amplifier.

12 Claims, 6 Drawing Sheets

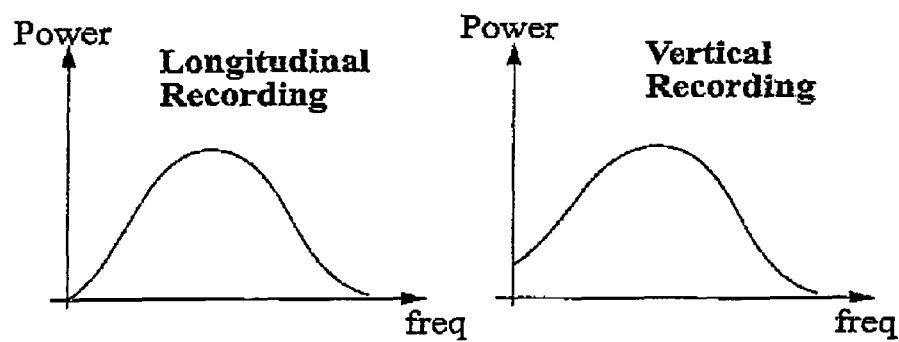
FIG. 1A
(PRIOR ART)
FIG. 1B
(PRIOR ART)
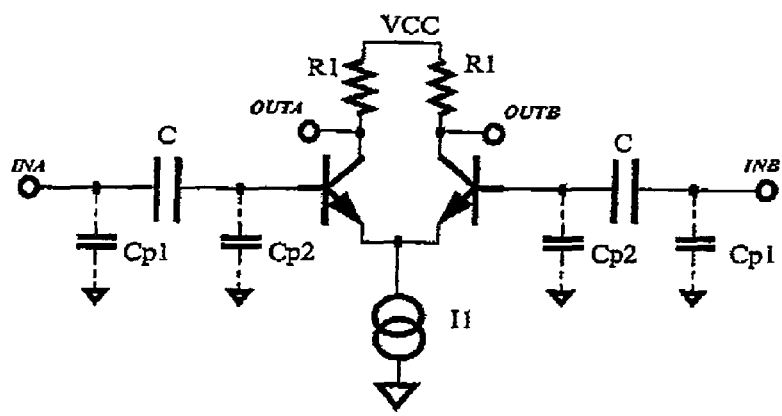
FIG. 2
(PRIOR ART)

AC DIFFERENTIAL AMPLIFIER WITH REDUCED LOW CORNER FREQUENCY

FIELD OF THE INVENTION

The present invention relates to AC amplifiers, and more particularly, to an AC low noise differential amplifier with reduced low-corner frequency (LCF).

BACKGROUND OF THE INVENTION

In many applications it is necessary to amplify an AC signal superimposed with a relatively large DC component. In these cases, an AC amplifier fed with the input signal through decoupling capacitors is commonly used. In particular, this is the case with signal channels used for recording data to hard disk drives (HDD).

Two modes of recording data on a HDD are longitudinal recording and vertical recording. Far an AC amplifier, a main difference between these two techniques includes a typical spectrum of an AC signal to be amplified when using the longitudinal recording technique, which differs noticeably from the spectrum of a corresponding signal when using the vertical recording technique.

In comparing the two diagrams of FIG. 1, signals used for recording data on a HDD using the vertical recording technique have a non-negligible power content at very low frequencies. Therefore, the pass band of AC amplifiers optimized for vertical recording should be extended to relatively low frequencies. In other words, they should have a reduced low corner frequency (LCF).

Typically, an AC amplifier is composed of a differential amplifier as shown in FIG. 2. A differential input signal is fed to the inputs INA and INB through respective decoupling input capacitors C. The architecture of this amplifier is very straightforward, but a sufficiently reduced LCF may only be achieved by using relatively large decoupling capacitors C.

Unfortunately, in silicon integrated circuits, when the size of the decoupling capacitors C is increased, the augmented parasitic capacitances CP1 and CP2 between the plates of the integrated capacitors and the silicon substrate on which the amplifier is formed significantly increase the input capacitance of the amplifier.

To keep parasitic capacitances smaller than a maximum acceptable value, these relatively large DC-decoupling capacitors should eventually be fabricated in a metal-dielectric-metal form. However, this means burdening the fabrication process with additional steps and fabrication masks.

SUMMARY OF THE INVENTION

In view of the foregoing background, an object of the invention is to provide an AC amplifier including decoupling capacitors that can be integrated in a common fabrication process without requiring dedicated or additional masks.

The DC component of the input signal may be effectively decoupled by positioning decoupling capacitors so that parasitic capacitances associated therewith do not degrade the input capacitance of AC amplifier. As a consequence, the decoupling capacitors may continue to be fabricated in a low cost manner, such as in the form of poly n-well capacitors. Poly n-well capacitors may be integrated in a common fabrication process without requiring dedicated or additional masks.

It is not necessary to use decoupling capacitors connected directly to the respective input nodes of the AC amplifier for filtering the DC component of the differential input. According to the invention, an effective filtering of the DC component in an AC amplifier may be obtained by connecting decoupling capacitors between ground and the input nodes of the two transconductance stages, which are AC grounded. This causes the effects of the parasitic capacitances on the input impedance of the amplifier to be negligible.

More precisely, the AC differential amplifier in accordance with the invention comprises a pair of identical differential transconductance stages, with the corresponding output nodes thereof being connected in common, and forming a pair of output nodes of the AC differential amplifier. The pair of output nodes are connected to a supply line through respective load resistors. An input node of one transconductance stage may be coupled through a capacitive device to an input node of the other transconductance stage. The other input nodes of the two transconductance stages form the input terminals of the AC amplifier.

BRIEF DESCRIPTION OF THE DRAWINGS

The different aspects and advantages of the invention will become more evident through a detailed description referring to the attached drawings, wherein:

FIGS. 1a and 1b are graphs respectively showing a sample power-frequency spectrum of signals used in the longitudinal recording and in the vertical recording of HDDs according to the prior art;

FIG. 2 is a circuit diagram of an AC amplifier according to the prior art;

DETAILED DESCRIPTION OF THE PREFERRED EMBODIMENTS

Figure 3:
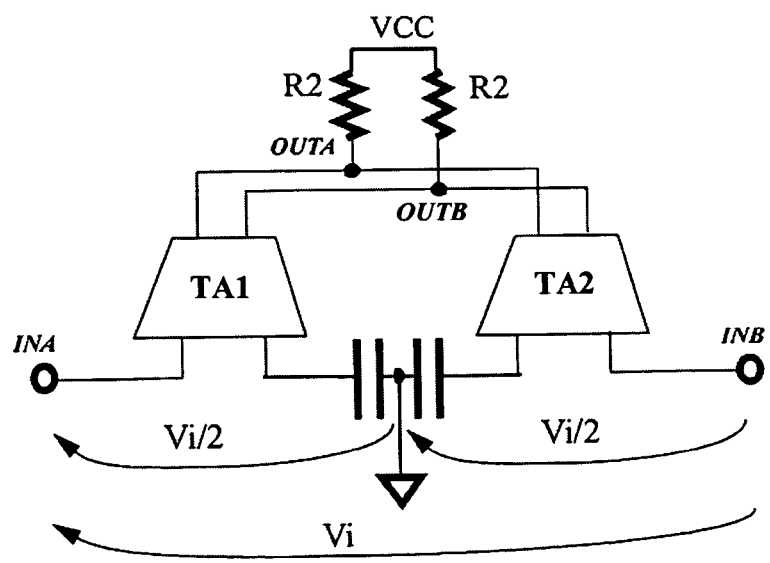
FIG. 3 is a circuit diagram of one embodiment of an AC differential amplifier according to the invention.
Figure 4:
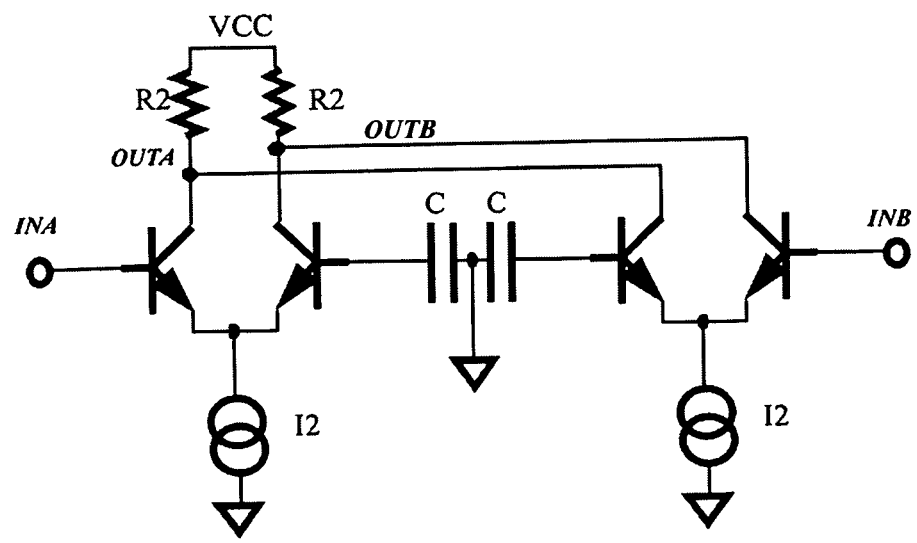
FIG. 4 is a more detailed circuit diagram of the AC differential amplifier of FIG. 3.

A basic architecture of the amplifier of the invention is depicted in FIG. 3, and a sample embodiment thereof using bipolar junction transistors (BJT) is depicted in FIG. 4. However, the same considerations that will be made substantially hold if the amplifier is also formed with field effect transistors (MOSFETs) instead of BJTs.

The AC differential amplifier of the invention is composed of two transconductance stages TA1 and TA2. The two transconductance stages include two respective inputs connected together in series through capacitors. The capacitors are composed, for example, of two capacitors connected in series, with an intermediate node therebetween being connected to ground. Corresponding output nodes of the transconductance stages are connected in common for summing the output currents on shared load resistors R.

The input signal applied to the input nodes INA and INB is filtered from its DC component even if there are no decoupling capacitors connected to (upstream of) the input nodes INA, INB of the amplifier. In fact, the effect of the two identical capacitors C is to make the DC voltages on the control nodes of the transistors of each differential pair equal to each other. This common mode voltage is rejected by the differential pairs.

This architecture addresses the problems caused by parasitic capacitances because the decoupling capacitor is not connected to the input nodes INA and INB for filtering the input signal from its DC component. Each decoupling capacitor is connected between ground and a control node of a transistor, which is an AC grounded node. This minimizes undesired effects of the parasitic capacitances on the input impedance of the amplifier.

Figure 5:
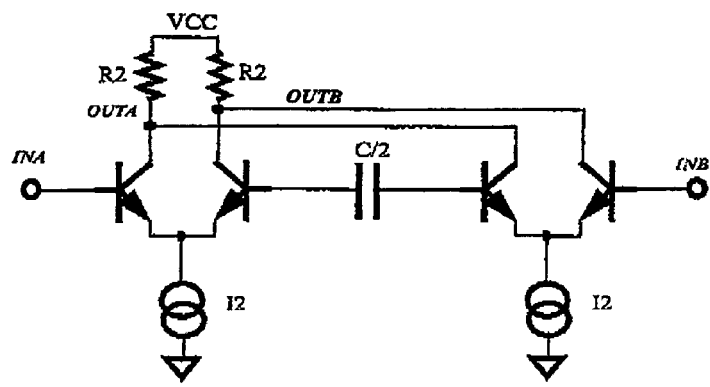
FIG. 5 is a circuit diagram of another embodiment of the AC differential amplifier according to the invention.

The circuit scheme of FIG. 5 is substantially equivalent to that of FIG. 4. In fact, at operating frequencies within the pass band, the capacitor C/2 connected between the two control nodes is short-circuited. As a result, these control nodes are practically grounded.

$G_M$ represents the transconductance of each stage. The transconductance of the amplifier of FIGS. 4 and 5 is $G_M$ because only one half of the input signal Vi is applied to each differential pair. Therefore, the objective of overcoming the problems due to parasitic capacitances is achieved at the cost of using two transconductance stages of gain $G_M$.

Figure 6:
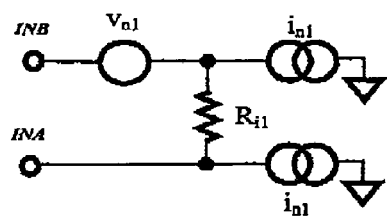
FIG. 6 is an equivalent noise circuit for the AC amplifier of FIG. 2.
Figure 7:
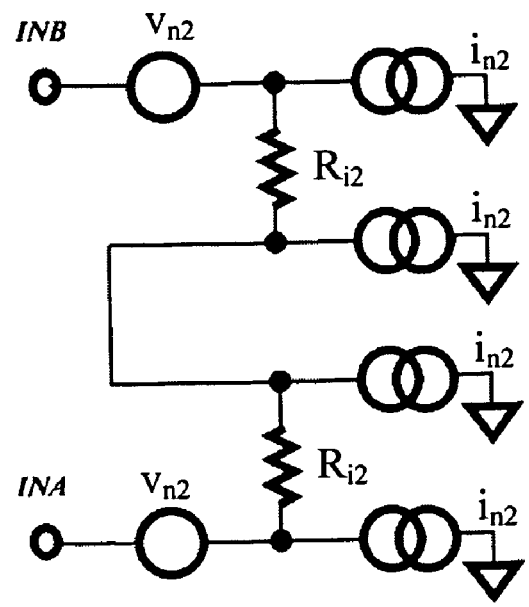
FIG. 7 is an equivalent noise circuit for the AC differential amplifier of FIGS. 4 and 5.
Figure 8:
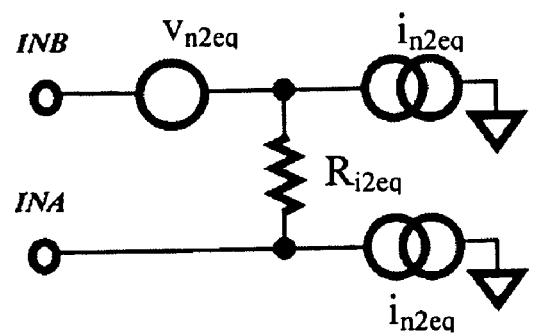
FIG. 8 is a simplified noise circuit for the equivalent noise circuit of FIG. 7.

A drawback of the circuit architectures of FIGS. 4 and 5 is in that the noise is higher than the noise of the known stage of FIG. 2. The equivalent noise circuit of the amplifier of FIG. 2 is depicted in FIG. 6. The noise circuit of the amplifier of FIGS. 4 and 5 is depicted in FIG. 7. FIG. 8 depicts a simplified noise circuit equivalent to that of FIG. 7 for comparing the noise figures of the amplifier of the invention with the known amplifier of FIG. 2.

The voltage generator $v_{n1}$ is a voltage noise source the power spectral density $v_{n1}^2$, of which is $$v_{n1}^2 = 8 \cdot K \cdot T \cdot \left( R_{BB1} + \frac{V_T}{I_1} \right),$$

wherein K is Boltzmann's constant, $V_T$ is the thermal voltage of the amplifier and $R_{BB1}$ is the base-access physical resistance of the transistors pair of the known amplifier of FIG. 2. The resistance $R_{i1}$ is the noise impedance of the amplifier.

The power spectral density of the noise equivalent current generator $i_{n1}$ is $$i_{n1}^2 = 2 \cdot q \cdot \frac{I_1}{2} \cdot \left( \frac{1}{\beta} + \frac{1}{\beta(\omega)^2} \right),$$

wherein q is the electron charge, β is the DC common-emitter forward short-circuit current gain and β(ω) is its value at frequency ω.

Similarly, the power spectral densities of the generators $v_{n2}$ and $i_{n2}$ in FIG. 7 are defined by the following formulas:

$$v_{n2}^2 = 8 \cdot K \cdot T \cdot \left( R_{BB2} + \frac{V_T}{I_2} \right), \text{ and}$$

$$i_{n2}^2 = 2 \cdot q \cdot \frac{I_2}{2} \cdot \left( \frac{1}{\beta} + \frac{1}{\beta(\omega)^2} \right),$$

wherein $R_{BB2}$ is the base-access physical resistance of each differential pair of transistors of FIGS. 4 and 5. The resistance $R_{i2}$ is the noiseless input impedance of each differential pair.

The respective power spectral densities of the voltage and current generators $v_{n2eq}$ and $i_{n2eq}$ of the noise equivalent circuit of FIG. 8 are defined by the following formulas:

$$v_{n2eq}^2 = 2 \cdot v_{n2}^2; \text{ and } i_{n2eq}^2 = i_{n2}^2,$$

and the resistance $R_{i2eq}$ is the noiseless input impedance of the whole amplifier and is given by the following formula:

$$R_{i2eq} = 2 \cdot R_{i2}.$$

By comparing the noise equivalent circuits of FIGS. 6 and 8, the noise figure of the amplifier of FIGS. 4 and 5 is higher than the noise figure of the known amplifier of FIG. 2. Indeed, the amplifier of the invention has the same input-referred voltage noise as compared to the known amplifier of FIG. 2 when $$R_{BB2} = R_{BB1}/2; \text{ and } I2 = 2 \cdot I1,$$

but at the same time the power spectral density $i_{n2eq}^2$ of the input-referred current noise is twice that of the known amplifier $$i_{n2eq}^2 = 2 \cdot i_{n1}^2.$$

In contrast, when $$I2 = I1$$

the known amplifier and the amplifier of the invention have the same input-referred current noise, but the power spectral density of the input-referred voltage noise of the amplifier of the invention is higher than the one of the known stage of FIG. 2. In particular, if $$R_{BB2} = R_{BB1}$$

then the power spectral density of the input-referred voltage noise of the amplifier of the invention is twice that of the known stage of FIG. 2:

$$v_{n2eq}^2 = 2 \cdot v_{n1}^2.$$

Generally speaking, the noise figures of the amplifiers of FIGS. 4 and 5 are worse than that of the amplifier of FIG. 2. The values of the current I2 and of the resistance $R_{BB2}$ should be chosen not only according to noise considerations but also considering that increasing the bias current I2 implies increasing the base-emitter capacitance of the transistor pair, and that for reducing the resistance $R_{BB2}$ it is necessary to increase the size of the transistors. This increases also their base-collector capacitances affecting the input capacitance of the amplifier.

Moreover, to optimize noise figures of the amplifier of the invention it is necessary to remember that (from the noise theory of amplifiers) the preferred noise figure is achieved when the noise impedance of the amplifier matches the impedance of the external generator of the signal to be amplified. Therefore, when the generator of the input signal has a relatively large impedance, it is desirable to reduce the input-referred current noise, and the other way around when the noise impedance of the external generator is relatively small.

This drawback of a larger noise figure of the amplifier of the invention, if desired, may be eliminated by a relatively minor increase in circuit complexity. According to a preferred embodiment of the invention, the noise performances of the amplifier of FIG. 4 or 5 at high frequencies are improved by connecting the common current nodes of the transistors of the two differential pairs by a shunt capacitor $C_{SHUNT}$, as shown in FIG. 9.

At high frequencies, the shunt capacitor operates as a short circuit and thus the voltage of the common current node of the transistors of the two differential pairs are in practice at the same voltage. Therefore, in the pass band the circuit of FIG. 9 is equivalent to the circuit depicted in FIG. 10, which is in practice identical to that of FIG. 2. The noise figure of the amplifier of FIG. 9 should be the same as the noise figure of the known circuit of FIG. 2, as confirmed by the following analysis.

Figure 9:
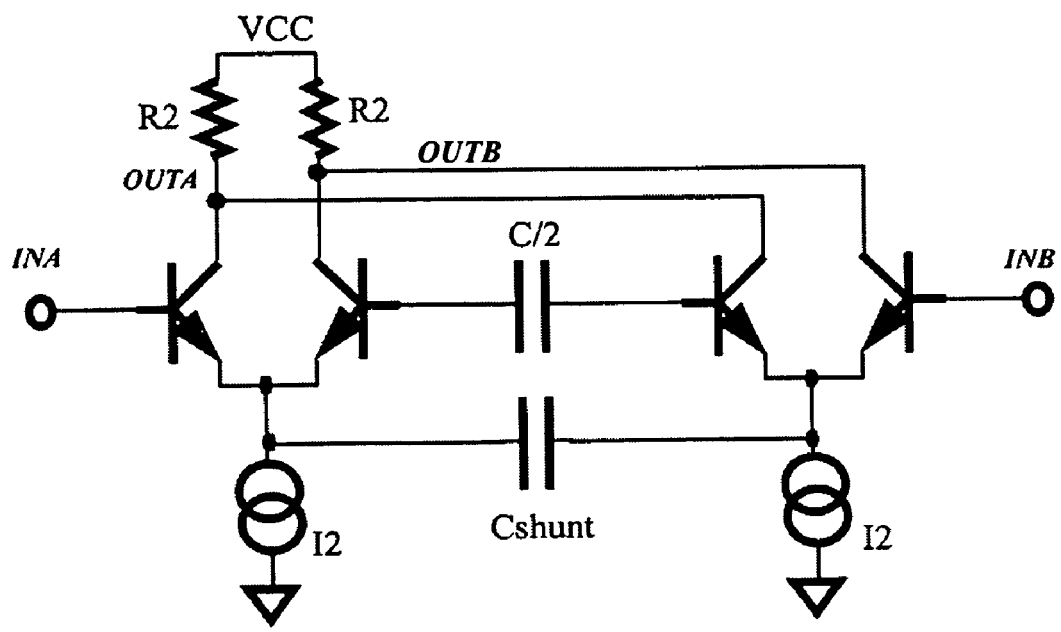
FIG. 9 is a circuit diagram of a preferred embodiment of the AC differential amplifier according to the invention.
Figure 10:
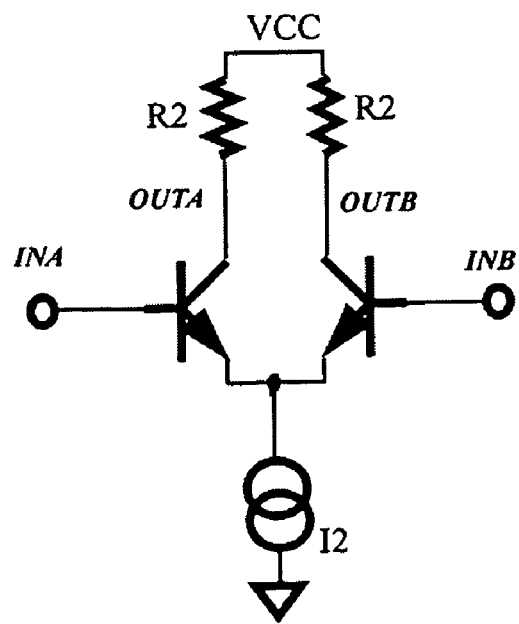
FIG. 10 is a high frequency equivalent circuit for the AC differential amplifier of FIG. 9.
Figure 11:
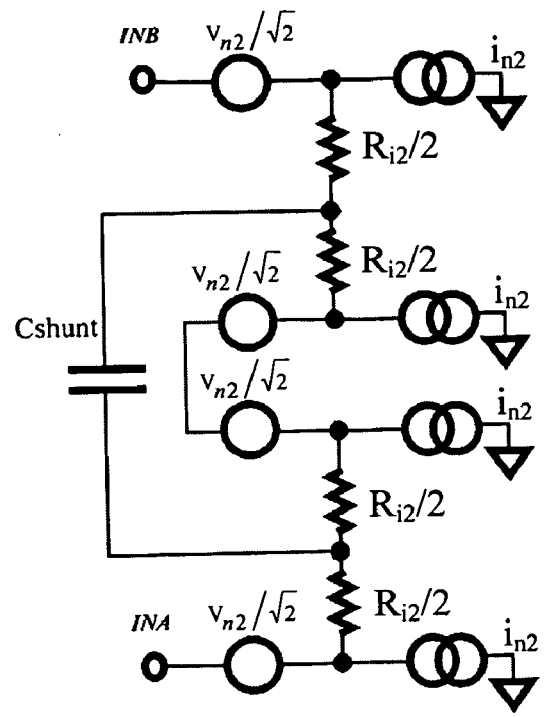
FIG. 11 is an equivalent noise circuit for the AC differential amplifier of FIG. 9.
Figure 12:
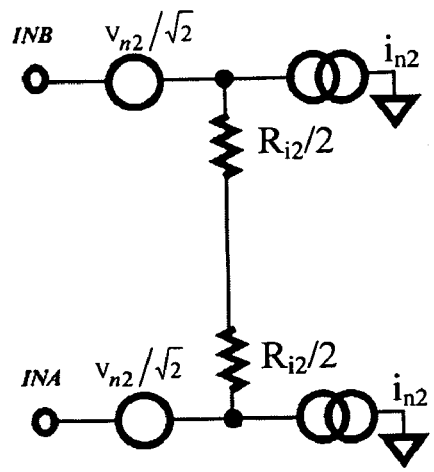
FIG. 12 is a simplified noise circuit equivalent to the noise circuit of FIG. 11.

The noise equivalent circuit of the preferred embodiment of the invention depicted in FIG. 9 is shown in FIG. 11. Simplifying this last noise circuit, one obtains the circuit of FIG. 12. The total power spectral density of the input-referred voltage noise of the amplifier of FIG. 12 is $$\left(\frac{v_{n2}}{\sqrt{2}}\right)^2 + \left(\frac{v_{n2}}{\sqrt{2}}\right)^2 = v_{n2}^2$$

which is half the power spectral density of the input-referred voltage noise of the amplifiers of FIGS. 4 and 5.

A large shunt capacitor reduces the noise in a wide frequency range but increases the input capacitance of the amplifier. In fact, without the shunt capacitor, the single-ended input capacitance due to the base-emitter capacitance C□ of the input transistors is halved C□/2, while at frequencies for which the capacitor $C_{SHUNT}$ operates as a short-circuit, the single-ended input capacitance due to the base-emitter capacitance C□ of the transistors is C□. The opportunity to use the shunt capacitor (and its size) should be evaluated according to the above considerations.

That which is claimed is:

1. An AC differential amplifier comprising:
   a pair of differential transconductance stages, each transconductance stage comprising
      first and second outputs respectively connected to the first and second outputs of the other transconductance stage and forming a pair of output nodes for the AC differential amplifier, and
      first and second inputs, with the first input of each transconductance stage forming an input terminal for the AC differential amplifier;
   a pair of load resistors connected between a voltage reference and respectively connected to the pair of output nodes; and
   a capacitive device connected between the second inputs of said pair of differential transconductance stages, said capacitive device comprising a pair of identical capacitors connected in series and forming an intermediate node therebetween, with the intermediate node being connected to a second voltage reference.

2. An AC differential amplifier according to claim 1, wherein each transconductance stage comprises:

a differential pair of transistors, each transistor comprising first and second conduction terminals and a control terminal, the second conduction terminals being connected together at a common current node, the control terminals respectively forming the first and second inputs of the AC differential amplifier, and the first conduction terminals respectively forming the first and second outputs of the AC differential amplifier; and
   a current generator connected to the common current node for biasing said differential pair of transistors.

3. An AC differential amplifier according to claim 2, further comprising a shunt capacitor connected in-line with the common current node and between the second conduction terminal of each transconductance stage.

4. An AC amplifier comprising:
   a pair of transconductance stages, each transconductance stage comprising
      first and second outputs respectively connected to the first and second outputs of the other transconductance stage and forming a pair of output nodes for the AC amplifier,
      first and second inputs, with the first input of each transconductance stage forming an input terminal for the AC amplifier,
      a differential pair of transistors, each transistor comprising first and second conduction terminals and a control terminal, the second conduction terminals being connected together at a common current node, the control terminals respectively forming the first and second inputs of the AC differential amplifier, and the first conduction terminals respectively forming the first and second outputs of the AC differential amplifier, and
      a current generator connected to the common current node for biasing said differential pair of transistors;
   a shunt capacitor connected in-line with the common current node and between the second conduction terminal of each transconductance stage;
   a pair of load resistors connected between a voltage reference and respectively connected to the pair of output nodes; and
   at least one capacitor connected between the second inputs of said pair of transconductance stages.

5. An AC amplifier according to claim 4, wherein said at least one capacitor comprises a pair of identical capacitors connected in series and forming an intermediate node therebetween, with the intermediate node being connected to a second voltage reference.

6. An AC amplifier according to claim 4, wherein said at least one capacitor comprises a single capacitor.

7. A method for forming an AC amplifier comprising:
   connecting a pair of differential transconductance stages together, each transconductance stage comprising
      first and second outputs respectively connected to the first and second outputs of the other transconductance stage and forming a pair of output nodes for the AC amplifier, and
      first and second inputs, with the first input of each transconductance stage forming an input terminal for the AC amplifier;
   connecting a pair of load resistors between a voltage reference and the pair of output nodes; and
   connecting at least one capacitor between the second inputs of the pair of differential transconductance stages, wherein the at least one capacitor comprises a pair of identical capacitors connected in series and forming an intermediate node therebetween, with the intermediate node being connected to a second voltage reference.

8. A method according to claim 7, wherein each transconductance stage comprises:
  a differential pair of transistors, each transistor comprising first and second conduction terminals and a control terminal, the second conduction terminals being connected together at a common current node, the control terminals respectively forming the first and second inputs of the AC differential amplifier, and the first conduction terminals respectively forming the first and second outputs of the AC differential amplifier; and
  a current generator connected to the common current node for biasing the differential pair of transistors.

9. A method according to claim 8, further comprising connecting a shunt capacitor in-line with the common current node and between the second conduction terminal of each transconductance stage.

10. A method for forming an AC amplifier comprising:
  connecting a pair of differential transconductance stages together, each transconductance stage comprising
    first and second outputs respectively connected to the first and second outputs of the other transconductance stage and forming a pair of output nodes for the AC amplifier,
    first and second inputs, with the first input of each transconductance stage forming an input terminal for the AC amplifier,
    a differential pair of transistors, each transistor comprising first and second conduction terminals and a control terminal, the second conduction terminals being connected together at a common current node, the control terminals respectively forming the first and second inputs of the AC differential amplifier, and the first conduction terminate respectively forming the first and second outputs of the AC differential amplifier, and
    a current generator connected to the common current node for biasing said differential pair of transistors;
  connecting a shunt capacitor in-line with the common current node and between the second conduction terminal of each transconductance stage;
  connecting a pair of load resistors between a voltage reference and the pair of output nodes; and
  connecting at least one capacitor between the second inputs of the pair of differential transconductance stages.

11. A method according to claim 10, wherein connecting the at least one capacitor comprises connecting a pair of identical capacitors in series and forming an intermediate node therebetween, with the intermediate node being connected to a second voltage reference.

12. A method according to claim 10, wherein connecting the at least one capacitor comprises connecting a single capacitor.

* * * * *

UNITED STATES PATENT AND TRADEMARK OFFICE
CERTIFICATE OF CORRECTION

PATENT NO.         : 7,095,279 B2
APPLICATION NO.    : 10/927431
DATED              : August 22, 2006
INVENTOR(S)        : Bollati It is certified that error appears in the above-identified patent and that said Letters Patent is hereby corrected as shown below:

Column 1, Line 19          Delete: "Far"
                           Insert -- For --

Column 1, Line 60          Delete: "of AC amplifier"
                           Insert -- of the AC amplifier --

Column 5, Lines 54-55      Delete: "transconductance"
                           Insert -- trans-conductance --

Column 8, Line 7           Delete: "terminate"
                           Insert -- terminals --

Signed and Sealed this

Twenty-seventh Day of March, 2007

JON W. DUDAS
*Director of the United States Patent and Trademark Office*